United States Patent [19]
Farley

[11] Patent Number: 5,382,753
[45] Date of Patent: Jan. 17, 1995

[54] HOUSING MODULE WITH SEMI-INTERLOCKING JOINTS

[75] Inventor: Mark H. Farley, Braselton, Ga.

[73] Assignee: Mitsubishi Consumer Electronics America, Inc., Braselton, Ga.

[21] Appl. No.: 44,498

[22] Filed: Apr. 9, 1993

[51] Int. Cl.⁶ .............................................. H02G 3/08
[52] U.S. Cl. ..................................... 174/52.1; 312/263
[58] Field of Search .................. 174/52.1, 52.3, 35 R, 174/35 GC; 361/395, 399, 424; 312/263, 264, 265.6, 284, 351.8, 351.7; 220/2.04, 2.33, 2.34

[56] References Cited

U.S. PATENT DOCUMENTS

| | | | |
|---|---|---|---|
| 3,450,293 | 6/1969 | Seda | 220/4.33 |
| 4,945,633 | 8/1990 | Hakanen | 29/825 |

*Primary Examiner*—Leo P. Picard
*Assistant Examiner*—Christopher Horgan
*Attorney, Agent, or Firm*—Rothwell, Figg, Ernst & Kurz

[57] ABSTRACT

An enclosure for housing electronic circuitry and the like, having a case and a cover which are mated together along edges thereof by substantially C-shaped flanges oriented in the same direction and asymmetrically with respect to each other to form semi-interlocking joints. Assembly and disassembly of the joints is accomplished by direct insertion and extraction without the need for sliding motion. The mating elements are locked together through the use of fasteners inserted into circular recesses formed by the flange members. The construction enables the use of internal dividing walls and shielding gaskets for forming electromagnetically isolated compartments within the housing enclosure.

11 Claims, 6 Drawing Sheets

HOUSING MODULE WITH SEMI-INTERLOCKING JOINTS

BACKGROUND OF THE INVENTION

1. Field of the Invention

This invention is generally related to receptacles formed by sectional components, and is specifically related to receptacles for housing electrical or electronic circuitry for apparatus such as communications equipment and the like.

2. Background and Prior Art

Housings for communications equipment such as mobile telephones and the like must not only physically protect the electronic circuitry of such apparatus, but must also shield the internal circuitry from electromagnetic interference (EMI) which comes from the surrounding environment, and must shield individual electronic components from radio-frequency interference (RFI) which is produced by other components of the equipment itself. Interference from EMI and RFI causes degradation in the performance of high-frequency circuitry, and thus it is necessary to electromagnetically isolate the circuitry components as much as possible from EMI and RFI. Gaskets made of electrically conductive materials, commonly known as shielding gaskets, may typically be used around the external edges of mating elements of the housing to isolate the circuitry from EMI. Shielding gaskets may also be used inside the housing to isolate sensitive circuitry such as high-frequency modulating or demodulating circuitry, from RFI produced by other nearby circuitry within the housing. This is typically accomplished by using internal dividing walls that compress the shielding gaskets against grounding trace lines on a printed circuit board to form closed electromagnetic barriers between different sections of the circuit board.

Prior constructions for such housings are known in the art; see, e.g., U.S. Pat. Nos. 3,450,293 and 4,711,361. Such constructions are characterized as being fully interlocking. That is, the separate elements of the housing are fully interlocked by sliding the mating parts of the elements with respect to each so that when the elements are aligned, they cannot be separated except by sliding in the same manner. Such fully interlocking joints had the advantage of being applicable to housings of constant cross section, making it possible to produce the housing elements by extrusion rather than by die casting, and thus reducing tooling cost and development time.

However, such fully interlocking constructions as exemplified by the above referenced patents are not well suited for equipment where internal electromagnetic shielding is required. This is because sliding the mating parts of the housing elements together may damage the shielding gaskets or dislocate the gaskets from their intended alignment within the housing. Thus, internal dividing walls employing shielding gaskets could not be used in these constructions. Fully interlocking constructions were also difficult and time consuming to assemble, requiring precise end-to-end alignment prior to sliding the mating elements together. Additionally, such prior constructions had a tendency to bind up during assembly from misalignment, warpage, or surface roughness.

Consequently, there exists a need in the art to provide a housing construction having mating elements which can be easily assembled and disassembled to facilitate the use of electromagnetic shielding gaskets for sensitive electronic circuitry enclosed within the housing.

SUMMARY OF THE INVENTION

The present invention provides a novel enclosure for housing electronic circuitry, whose elements are easily assembled and disassembled without sliding mating parts of the elements together.

The present invention further provides a novel edge joint for joining the mating elements of a housing together without requiring sliding motion.

The present invention further provides a novel enclosure having novel edge joints for joining the elements of said housing together, which housing is of constant cross-section and may be manufactured by an extrusion process.

The present invention further provides an edge joint for joining two mating planar elements, comprising a substantially C-shaped flange extending along an edge of each of said planar elements; each substantially C-shaped flange having an inner curving member and an outer curving member; said inner curving member including first and second flat outer surfaces perpendicular to each other; said outer curving member including first and second flat inner surfaces perpendicular to each other; first and second flat outer surfaces of the inner curving member of the flange of one of said planar elements contacting the first and second flat inner surfaces of the outer curving member of the flange of the other of said planar elements; first and second flat inner surfaces of the outer curving member of the flange of said one of said planar elements contacting the first and second flat outer surfaces of the inner curving member of the flange of said other of said planar elements; wherein inner curved surfaces of the inner curving members of the flanges form recesses into which fasteners may be placed, the fasteners locking said flanges of said planar elements together.

BRIEF DESCRIPTION OF THE DRAWINGS

The present invention will become more fully understood from the detailed description hereinbelow and the accompanying drawings, which are given by way of illustration only and are not limitative of the present invention, and wherein.

DETAILED DESCRIPTION OF THE PREFERRED EMBODIMENT

Figure 1:
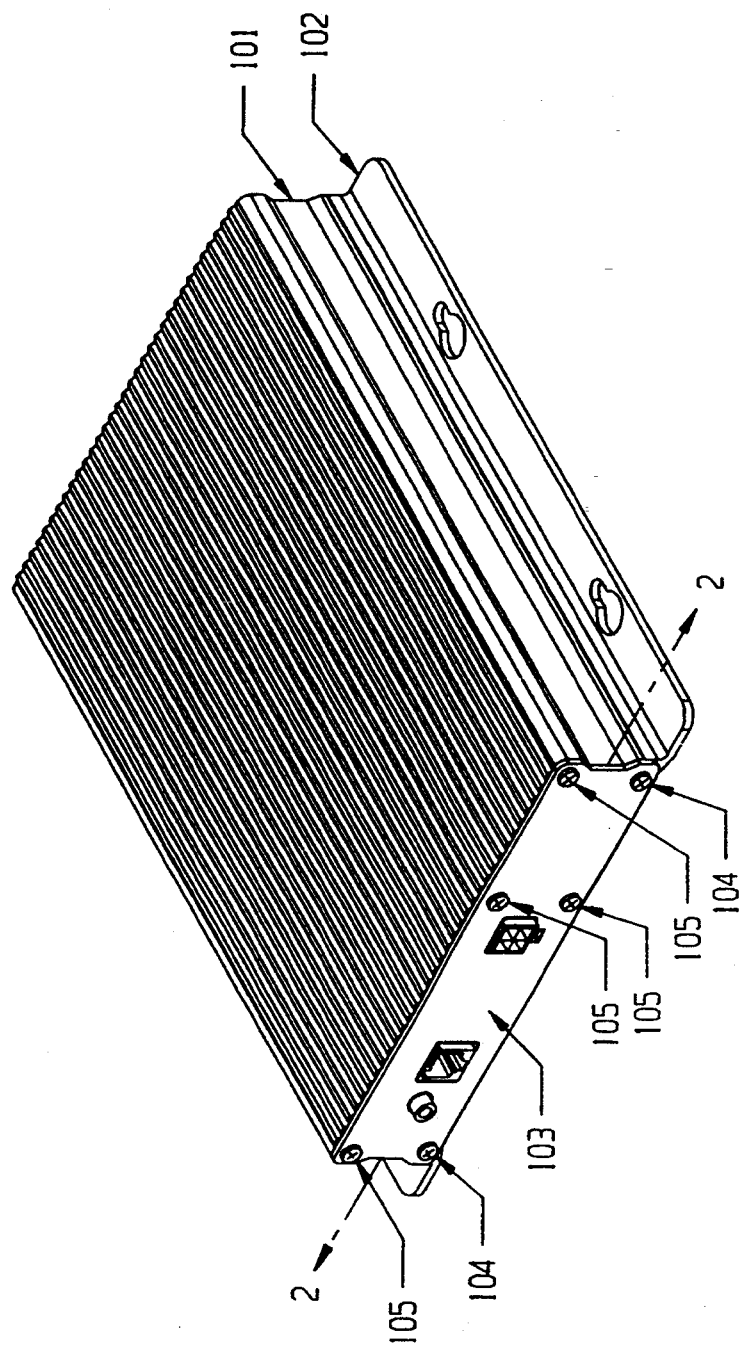
FIG. 1 is an isometric view of an enclosure for housing electronic circuitry which may employ the present invention.

FIG. 1 shows a housing or enclosure according to the present invention, that may be used to house electronic circuitry or other hardware which requires shielding from electromagnetic radiation and/or mechanical protection from the environment. The housing is comprised of a generally planar case 101 and a generally planar cover 102 which are mated together. Each end of the case and cover assembly is capped by a face plate 103. Fastener screws 104 lock the case and cover in place together, and secure the face plate 103 to the case and cover in conjunction with additional face plate screws 105.

Figure 2:
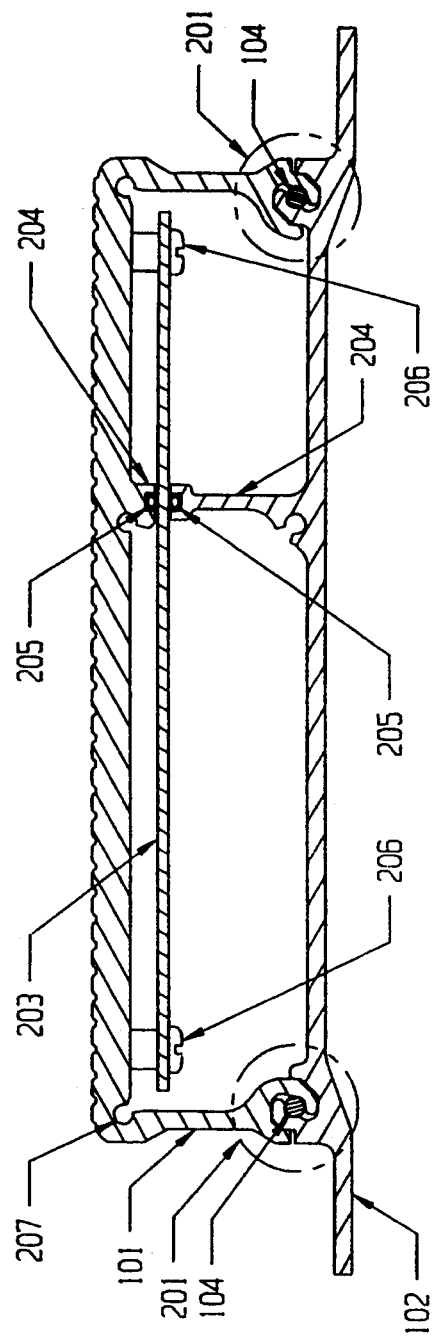
FIG. 2 is a cross-sectional view of the novel enclosure taken along line 2—2 of FIG. 1 according to one preferred embodiment of the present invention.

FIG. 2 shows a cross-section of the housing of FIG. 1 along lines 2—2. The case 101 and cover 102 are mated together by a dovetail joint 201 at each end thereof. The case and cover are locked tightly together in place by fastener screws 104 which are lengthwise inserted in recesses formed in the inner members of each joint. If the fastener screws 104 are removed, the case and cover may be easily separated without requiring any sliding motion therebetween. Thus, the joints 201 may be described as being semi-interlocking.

A printed circuit board 203 is attached to the case 101 with attaching screws 206. The circuit board is divided into isolated sections by internal dividing walls 204 extending perpendicularly from the case 101 and cover 102 and pressing against shielding gaskets 205 which are aligned with grounding traces on the circuit board 203. When the case and cover are locked together, the dividing walls compress the gaskets against the circuit board, thereby forming two electromagnetically isolated compartments within the housing, each of which may enclose separate electronic circuit components which otherwise would interfere with each other in operation.

Figure 3:
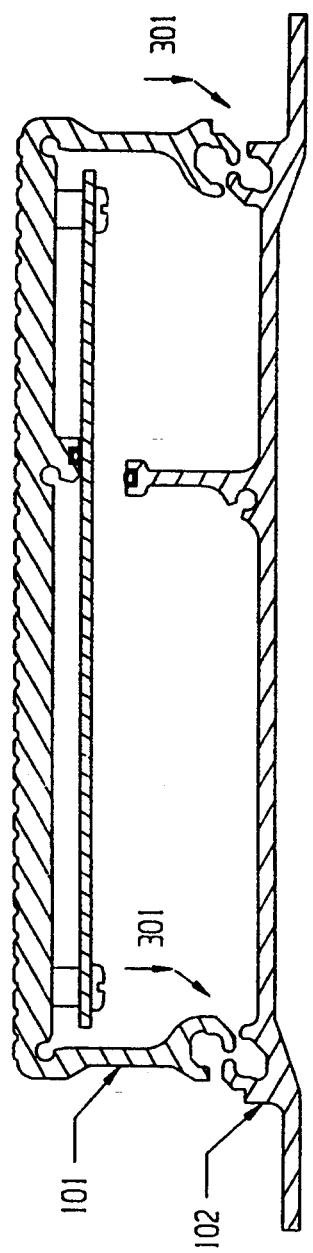
FIG. 3 is a cross-sectional view of the novel enclosure illustrating the oblique motion between mating elements for assembly and disassembly of the enclosure.

As shown in FIG. 3, the joints at each end of the case and cover are asymmetrically oriented with respect to each other, i.e., they are not mirror images of each other. This configuration enables the case and cover to be joined together with a simple "drop-in" motion without sliding along the edges thereof. Numeral 301 represents the angle of insertion and extraction between the case 101 and cover 102. This angle may vary with different embodiments of the invention, but in general the case and cover elements mate obliquely at an acute angle relative to the contacting surfaces within the joints.

Figure 4:
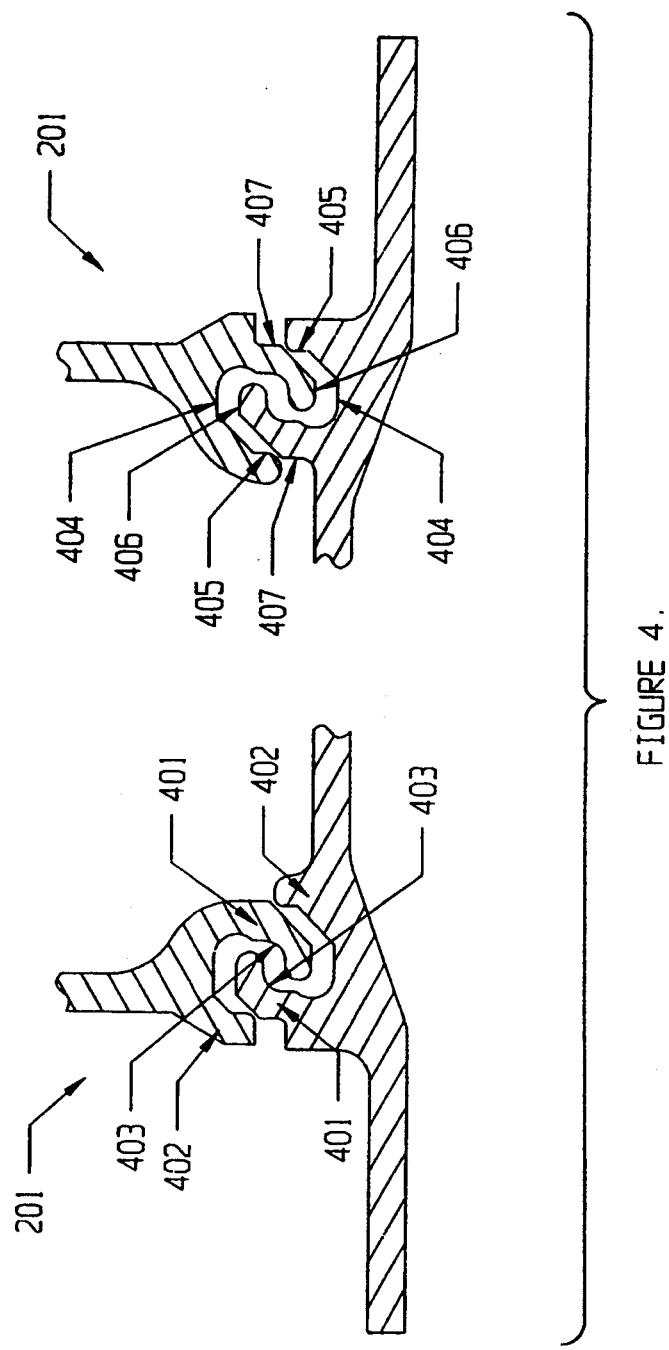
FIG. 4 is a cross-sectional disjoined view illustrating in detail joints 201 of FIG. 2 during assembly.

Details of the geometry of the joints 201 are shown in FIG. 4. Because the joints cannot fully interlock with each other without a fastener screw, the mating elements can be easily assembled and disassembled without sliding motion therebetween. Accordingly, use of the fastener screws 104 is essential for locking the elements together. Additionally, the joint flanges of the mating elements contact each other at four distinct flat surfaces, which serve as environmental and electromagnetic barriers.

The case and cover elements have substantially C-shaped flanges extending along edges thereof; the shapes of these flanges may be slightly different because of the asymmetrical orientation of the joints, but the functions of corresponding parts are identical. Each joint 201 is comprised of two substantially C-shaped flanges which nest together at four contact surfaces. Each C-shaped flange is characterized by an inner curving member 401 and an outer curving member 402. Member 401 of the case nests with member 402 of the cover, and member 401 of the cover nests with member 402 of the case. The inner curving members 401 have arc-shaped recesses 403 which combine to form a circular recess into which a fastener screw is inserted. Each inner curving member 401 has two flat outer surfaces 406 and 407 which are substantially perpendicular to each other, and each outer curving member 402 has two flat inner surfaces 404 and 405 which are substantially perpendicular to each other. Inner surface 404 of outer curving member 402 contacts with outer surface 406 of inner curving member 401, and inner surface 405 of member 402 contacts with outer surface 407 of member 401.

Figure 5:
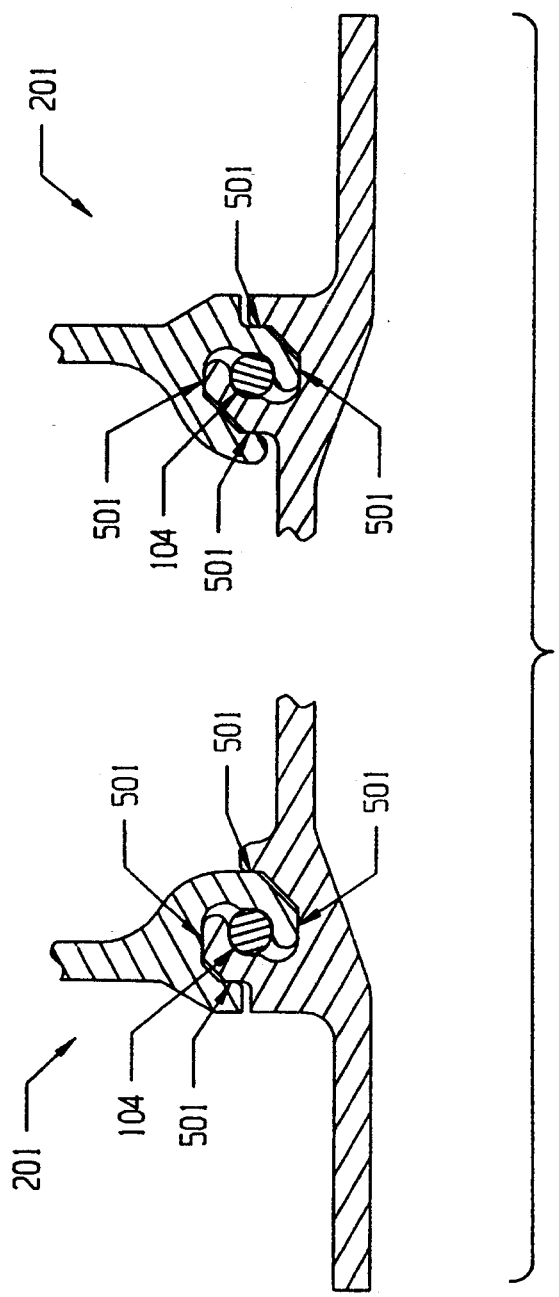
FIG. 5 is a cross-sectional disjoined view illustrating in detail joints 201 of FIG. 2 after assembly and insertion of a fastener element.

As shown in FIG. 5, the two C-shaped flanges of the case and cover contact each other at four locations 501, two of which are substantially horizontal and two of which are substantially vertical. The distance and angle between the flat surfaces of the mating elements, while not critical from a quantitative view, must be identical within each joint so that the surfaces can make proper contact and thus align the circular recess for accommodating the fastener screws 104. The flanges at each end of the mating elements must also be oriented in the same direction so that the elements can be assembled without sliding motion along the edges thereof.

Figure 6:
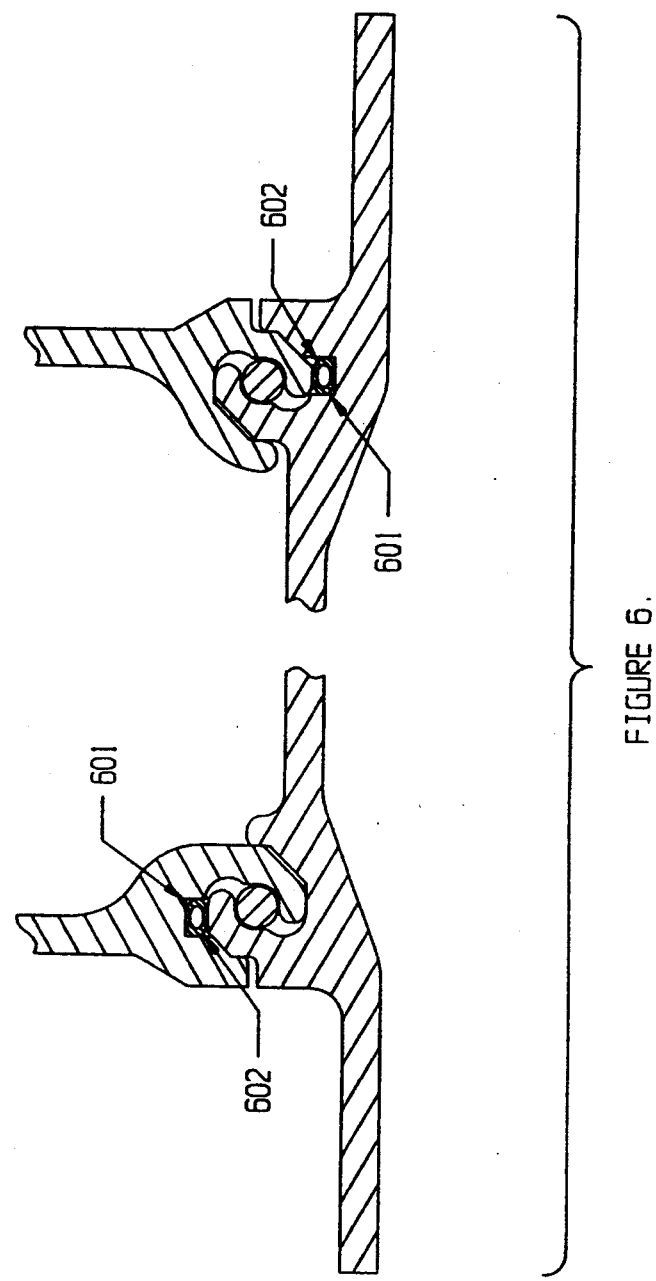
FIG. 6 is a cross-sectional disjoined view of an alternative embodiment of the present invention including an optional groove and gasket assembly for sealing the joints 201.

FIG. 6 shows an alternative embodiment according to the present invention in which a groove 601 is formed in the flange of either the case or cover element, into which an additional gasket 602 is placed. This additional gasket 602 provides improved shielding from electromagnetic interference and/or tighter weatherproofing from the external environment. Depending upon the different type of gasket material selected, the groove 601 may not be necessary.

What is claimed is:

1. An edge joint for joining two mating planar elements, comprising:
    a substantially C-shaped flange extending along an edge of each of said planar elements;
    each substantially C-shaped flange having an inner curving member and an outer curving member;
    said inner curving member including first and second flat outer surfaces perpendicular to each other;
    said outer curving member including first and second flat inner surfaces perpendicular to each other;
    first and second flat outer surfaces of the inner curving member of the flange of one of said planar elements contacting the first and second flat inner surfaces of the outer curving member of the flange of the other of said planar elements; and
    first and second flat inner surfaces of the outer curving member of the flange of said one of said planar elements contacting the first and second flat outer surfaces of the inner curving member of the flange of said other of said planar elements.

2. An edge joint as set forth in claim 1, wherein said inner curving member of each of said substantially C-shaped flanges of said mating planar elements includes an arc-shaped recess in an inner surface thereof which combines with the arc-shaped recess of the inner curving member of the flange of the other mating planar element to form a circular recess which accommodates a fastener for locking said mating elements in place.

3. An edge joint as set forth in claim 2, wherein at least one of said substantially C-shaped flanges includes a groove which accommodates a gasket for sealing said joint.

4. An edge joint as set forth in claim 2, further including said fastener, wherein said fastener constitutes the sole mechanism for locking said mating elements in place.

5. An enclosure, including two edge joints as set forth in claim 1, wherein one of said mating elements comprises a case, and the other of said mating elements comprises a cover for said case, said cover having said substantially C-shaped flanges extending along first and second edges thereof, and said case having said substantially C-shaped flanges extending along first and second edges thereof, the substantially C-shaped flanges of said cover mating with the substantially C-shaped flanges of said case to form said two edge joints.

6. An enclosure as set forth in claim 5, wherein said enclosure houses electronic circuitry, said cover and said case each having one or more internal dividing walls which combine to form isolated sections within said enclosure which isolate portions of said electronic circuitry from each other.

7. An enclosure as set forth in claim 5, wherein said substantially C-shaped flanges of said case and said cover are asymmetrically oriented with respect to each other.

8. An enclosure, comprising a case and a cover for said case, wherein each of said cover and said case include substantially C-shaped flanges extending along edges thereof which nest with each other so as to join said case and said cover together; and wherein said substantially C-shaped flanges of said cover are obliquely engageable with said substantially C-shaped flanges of said case without requiring sliding motion thereof along the length of said edges, said flanges of said cover being engaged with said flanges of said case to form said enclosure.

9. An enclosure as set forth in claim 8, wherein said enclosure houses electronic circuitry, said cover and said case each having one or more internal dividing walls which combine to form isolated sections within said enclosure which isolate portions of said electronic circuitry from each other.

10. An enclosure as set forth in claim 8, wherein said substantially C-shaped flanges of said case and said cover are asymmetrically oriented with respect to each other.

11. A method for joining two mating planar elements, comprising:
providing a substantially C-shaped flange extending along an edge of each of said planar elements, each substantially C-shaped flange having an inner curving member and an outer curving member;
aligning said edges of said planar elements so that ends of said planar elements are coplanar; and
engaging said substantially C-shaped flanges with each other through oblique motion without sliding along said edges so that said inner curving members of each flange contact said outer curving members of the other flange.

* * * * *